(12) United States Patent
Lin et al.

(10) Patent No.: US 10,782,255 B2
(45) Date of Patent: Sep. 22, 2020

(54) NMR MULTI-DIMENSIONAL METHOD FOR MEASURING COUPLING CONSTANTS WITHIN SEVERAL COUPLING NETWORKS

(71) Applicant: XIAMEN UNIVERSITY, Xiamen (CN)

(72) Inventors: Yanqin Lin, Xiamen (CN); Qing Zeng, Xiamen (CN); Jinyong Chen, Xiamen (CN); Zhong Chen, Xiamen (CN)

(73) Assignee: XIAMEN UNIVERSITY, Xiamen (CN)

( * ) Notice: Subject to any disclaimer, the term of this patent is extended or adjusted under 35 U.S.C. 154(b) by 56 days.

(21) Appl. No.: 16/315,084

(22) PCT Filed: Jan. 8, 2018

(86) PCT No.: PCT/CN2018/071808
§ 371 (c)(1),
(2) Date: Jan. 3, 2019

(87) PCT Pub. No.: WO2018/130132
PCT Pub. Date: Jul. 19, 2018

(65) Prior Publication Data
US 2019/0310210 A1    Oct. 10, 2019

(30) Foreign Application Priority Data

Jan. 13, 2017  (CN) .......................... 2017 1 0025922

(51) Int. Cl.
*G01V 3/00*        (2006.01)
*G01N 24/08*      (2006.01)
*G01R 33/46*      (2006.01)

(52) U.S. Cl.
CPC ......... *G01N 24/08* (2013.01); *G01R 33/4608* (2013.01); *G01R 33/4616* (2013.01); *G01R 33/4625* (2013.01)

(58) Field of Classification Search
CPC .............. G01R 33/543; G01R 33/5659; G01R 33/3415; G01R 33/36; A61B 5/055
(Continued)

(56) References Cited

U.S. PATENT DOCUMENTS 4,703,270 A    10/1987  Hall et al.
4,769,604 A     9/1988  Sepponen

FOREIGN PATENT DOCUMENTS

CN    103885013 A     6/2014
CN    104237820 A    12/2014
(Continued)

OTHER PUBLICATIONS

Sinnaeve et al., A General Method for Extracting Individual Coupling Constants from Crowded 1H NMR Spectra, Angew. Chen. Int. Ed. 2015, 54, pp. 1-5.

*Primary Examiner* — Walter L Lindsay, Jr.
*Assistant Examiner* — Frederick Wenderoth
(74) *Attorney, Agent, or Firm* — Cooper Legal Group, LLC

(57) ABSTRACT

This invention provides a NMR multi-dimensional method for measuring coupling constants within several coupling networks. At first, a 90° hard pulse was performed to flip the magnetization from the Z axis to the XY plane. After $t_1/2$, a selective 180° pulse is implemented with a simultaneous Z-direction gradient, thus reversing different protons at different slices. Then the PSYCHE element is implemented. After another $t_1/2$, the gradient $G_1$ and $G_p$ are implemented. At last, the EPSI readout is used to simultaneously record both the chemical-shift and the spatial information. As a result, from different specific slices, we can extract the scalar couplings between the proton reversed at this slice and other (Continued)

Figure 1:
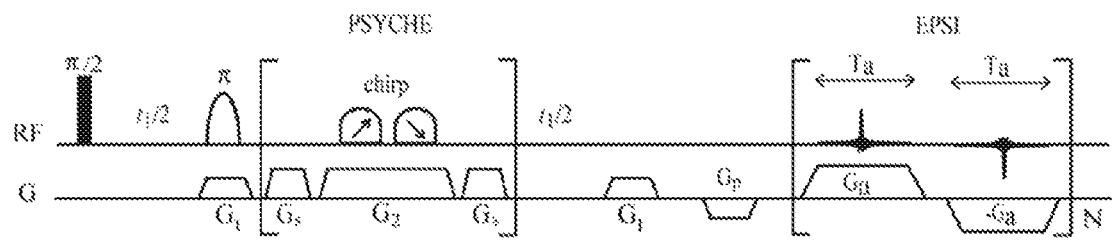

protons. These couplings lead to splittings in the indirect dimension, from which relevant coupling constants can be measured.

10 Claims, 3 Drawing Sheets

(58) Field of Classification Search
 USPC .......................................................... 324/309
 See application file for complete search history.

(56) References Cited

FOREIGN PATENT DOCUMENTS

| | | | |
|---|---|---|---|
| CN | 105092629 A | 11/2015 | |
| CN | 106093099 A | 11/2016 | |
| CN | 106706694 A | 5/2017 | |

NMR MULTI-DIMENSIONAL METHOD FOR MEASURING COUPLING CONSTANTS WITHIN SEVERAL COUPLING NETWORKS

TECHNOLOGY DOMAIN

This invention is associated with NMR multi-dimensional spectroscopy. It is an NMR multi-dimensional spectroscopy for measuring $^1$H—$^1$H coupling values within several coupling networks.

BACKGROUND TECHNOLOGY

Spin-spin coupling, an important parameter in NMR spectroscopy, plays an important role in molecular structure analysis. Among various scalar couplings, the three-bond $^1$H—$^1$H coupling, whose magnitude is dependent on the dihedral angle between the two C—H vectors, is widely used in molecular conformational study. However, the measurement of $^1$H—$^1$H coupling constants is often hampered by small chemical-shift dispersion and complex splitting patterns. A PSYCHEDELIC method was proposed by Davy Sinnaeve et al. for revealing the scalar coupling network of a selected proton and measuring relevant coupling constants, greatly facilitating the measurement of J values (D. Sinnaeve, M. Foroozandeh, M. Nilsson, G. A. Morris, A general method for extracting individual coupling constants from crowded $^1$H NMR spectra, Angew. Chem. Int. Ed. 55 (2016) 1090-1093.). However, this method can analyze only one coupling networks at a time. Several experiments are needed for revealing all coupling networks.

Invention Content

This invention is aimed at providing a simple and convenient NMR spectroscopy for simultaneously revealing several scalar coupling networks and extracting all coupling constants within them.

In order to solve the technical problem mentioned above, this invention provides an NMR multi-dimensional method for measuring coupling constants within several coupling networks, and the main steps are as below:

1) Acquire a conventional NMR 1D spectrum of the sample;
2) Measure the duration of the 90° hard pulse;
3) Set the range of the spectrum for analysis;
4) Set the duration of the selective 180° pulse according to the interval of the closest resonances, then measure the power of the selective 180° pulse, and place the excitation center of the selective pulse to the center frequency of the range of the spectrum for analysis;
5) Set the spatial frequency encoding gradient $G_1$, which should satisfy $\gamma*G_1*L>SW_{1D}$, where $\gamma$ is the gyromagnetic ratio, L is the length of the detection region of the sample, and $SW_{1D}$ is the spectral width of the 1D spectrum;
6) Set the spoiling gradient $G_s$;
7) Set the gradient $G_2$, which should satisfy $\gamma*G_2*L>SW_{1D}$;
8) Set the sweep range of the chirp pulses (pbw), which should satisfy $pbw>\gamma*G_2*L$;
9) Set the flip angle ($\beta$) and the duration of the chirp pules, measure the power of the chirp pulse with flip angle $\beta$, and the sweeping directions of the two chirp pulses should be opposite;
10) Set the gradient $G_a$, which should satisfy that $\gamma*G_a*L<SW$ (SW is the sampling frequency) and that $\gamma*G_a*L>>SW_{1D}$;
11) Set the gradient $G_p$, which is used to adjust the positions of echo centers;
12) Set the duration of the acquisition widow ($T_a$), which should satisfy that $1/(2*T_a) \geq SW_{1D}$;
13) Set the number of increments in the indirect dimension (ni) and the number of loops of the acquisition windows (N);
14) Use the measured 90° hard pulse as the excitation pulse of the pulse sequence. After $t_1/2$, implement the selective 180° pulse and the gradient $G_1$, then implement the PSYCHE element. And after another $t_1/2$, implement the gradient $G_1$ and $G_p$, then repeat the EPSI readout for N times and acquire NMR signals.

The PSYCHE element mentioned above includes two chirp pulses with small flip angle and opposite sweeping directions, and a simultaneously applied gradient $G_2$. The PSYCHE element is flanked by two spoiling gradients $G_s$.

The EPSI readout mentioned above includes oscillating gradients $G_a$ and $-G_a$, and simultaneous samplings, of which the duration under one gradient is $T_a$.

The number of the increments (ni) should be set according to the required digital resolution in the indirect dimension: $ni=SW_1/v_1$, where $v_1$ is the digital resolution in the indirect dimension and $SW_1$ is the spectral width in the indirect dimension.

The number of loops of the acquisition windows (N) should be set according to the required digital resolution in the direct dimension: $N=SW_{1D}/v_2$, where $v_2$ is the digital resolution in the direct dimension.

The flip angle of the chirp pulses ($\beta$) is chosen for the balance between signal-to-noise ratio (SNR) and spectral purity. Larger $\beta$ results in higher SNR, but leads to stronger artifacts. In general, $\beta$ can be set as 15°~20°.

This invention provides an NMR multi-dimensional method for measuring coupling constants within several coupling networks. After the excitation of the 90° hard pulse, in the middle of the evolution time $t_1$, a selective 180° pulse and a gradient are implemented simultaneously, then two chirp pulses with low flip angle and opposite sweeping direction is implemented at the presence of another gradient. The two chirp pulses are flanked by a pair of spoiling gradient for the selection of coherence transfer pathway. After the gradient $G_p$, the EPSI readout is used to record NMR signals. Several scalar networks can be revealed through our experiment, with relevant coupling constants extracted.

FIGURE EXPLANATION

FIG. 1. The pulse sequence for measuring coupling constants within several coupling networks.

Figure 2:
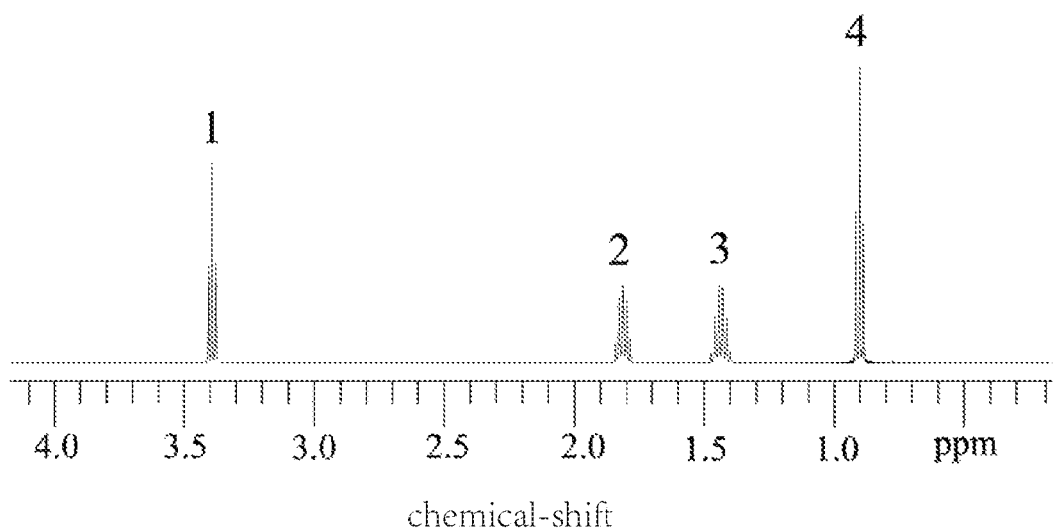

FIG. 2. The NMR 1D $^1$H spectrum of the n-butyl bromide.

Figure 3:
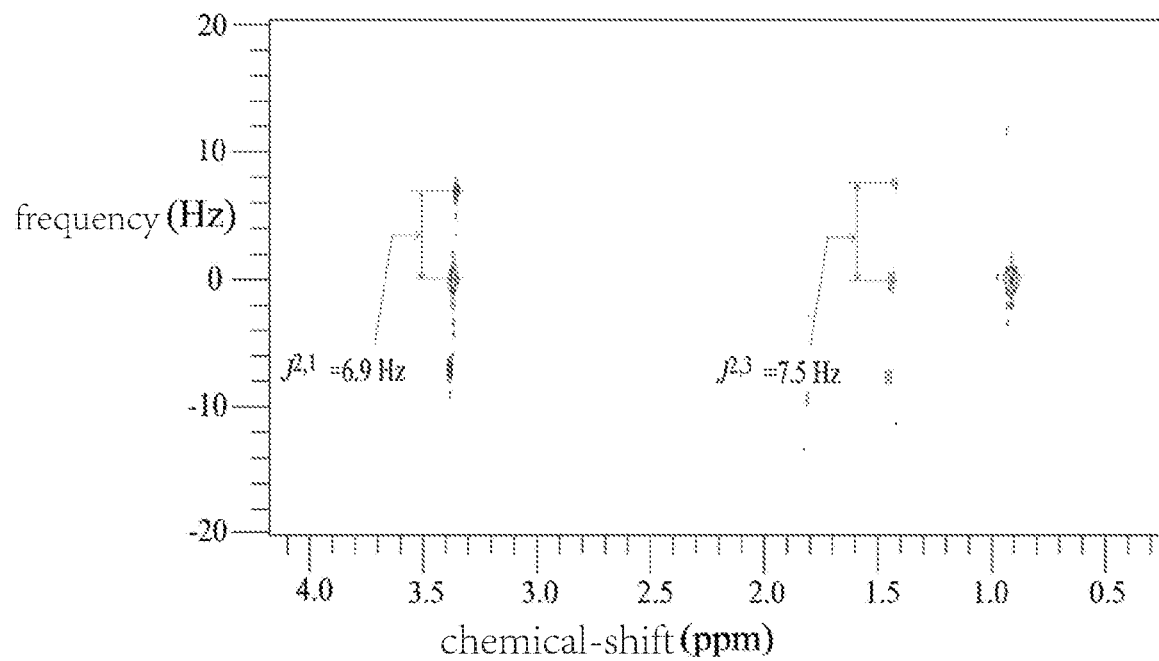

FIG. 3. The 2D spectrum corresponding to the coupling network of proton H2.

Figure 4:
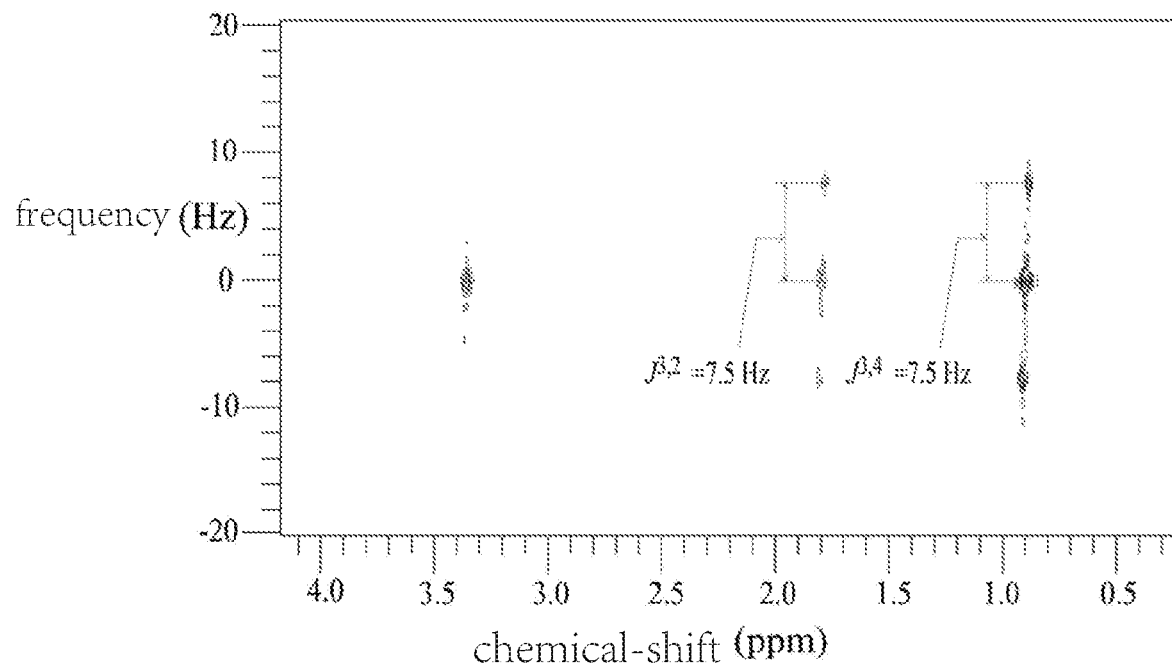

FIG. 4. The 2D spectrum corresponding to the coupling network of proton H3.

Figure 5:
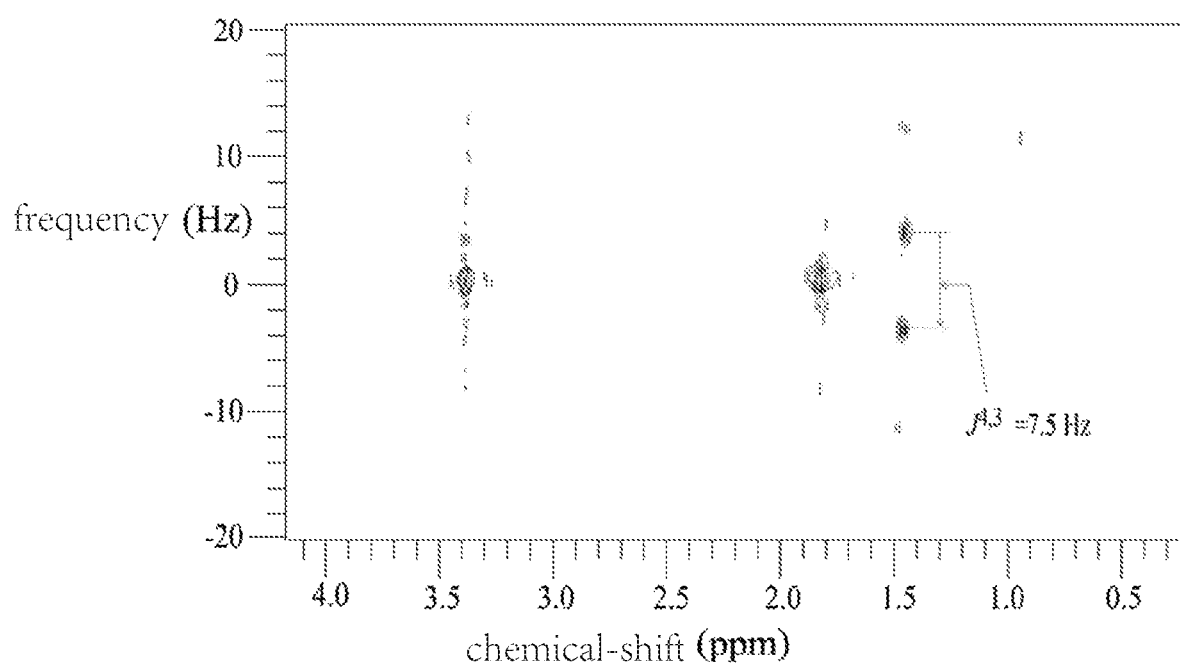

FIG. 5. The 2D spectrum corresponding to the coupling network of proton H4.

SPECIFIC IMPLEMENTATION MANNER

Now we combine the figures and a practical example to further explain our invention.

This invention provides an NMR multi-dimensional method for measuring coupling constants within several coupling networks, and the main steps are as below:

1) Acquire an conventional NMR 1D spectrum of the sample;

2) Measure the duration of the 90° hard pulse;

3) Set the range of the spectrum for analysis;

4) Set the duration of the selective 180° pulse according to the interval of the closest resonances, then measure the power of the selective 180° pulse, and place the excitation center of the selective pulse to the center frequency of the range of the spectrum for analysis;

5) Set the spatial frequency encoding gradient $G_1$, which should satisfy $\gamma*G_1*L>SW_{1D}$, where $\gamma$ is the gyromagnetic ratio, L is the length of the detection region of the sample, and $SW_{1D}$ is the spectral width of the 1D spectrum;

6) Set the spoiling gradient $G_s$;

7) Set the gradient $G_2$, which should satisfy $\gamma*G_2*L>SW1D$;

8) Set the sweep range of the chirp pulses (pbw), which should satisfy $pbw>\gamma*G_2*L$;

9) Set the flip angle ($\beta$) and the duration of the chirp pules, measure the power of the chirp pulse with flip angle $\beta$, and the sweeping directions of the two chirp pulses should be opposite;

10) Set the gradient $G_a$, which should satisfy that $\gamma*G_a*L<SW$ (SW is the sampling frequency) and that $\gamma*G_a*L>>SW_{1D}$;

11) Set the gradient $G_p$, which is used to adjust the positions of echo centers;

12) Set the duration of the acquisition widow ($T_a$), which should satisfy that $1/(2*T_a) \geq SW_{1D}$;

13) Set the number of increments in the indirect dimension (ni) and the number of loops of the acquisition windows (N);

14) Use the measured 90° hard pulse as the excitation pulses of the pulse sequence. After $t_1/2$, implement the selective 180° pulse and the gradient $G_1$, then implement the PSYCHE element. And after another $t_1/2$, implement the gradient $G_1$ and $G_p$, then repeat the EPSI readout for N times and acquire NMR signals.

After disentangling different signals, relevant J coupling constants can be measured.

The PSYCHE element mentioned above includes two chirp pulses with small flip angle and opposite sweeping directions, and a simultaneously applied gradient $G_2$. The PSYCHE element is flanked by two spoiling gradients $G_s$.

The EPSI readout mentioned above includes oscillating gradients $G_a$ and $-G_a$, and simultaneous samplings, of which the duration under one gradient is $T_a$.

The number of the increments (ni) should be set according to the required digital resolution in the indirect dimension: $ni=SW_1/v_1$, where $v_1$ is the digital resolution in the indirect dimension and $SW_1$ is the spectral width in the indirect dimension.

The number of loops of the acquisition windows (N) should be set according to the required digital resolution in the direct dimension: $N=SW_{1D}/v_2$, where $v_2$ is the digital resolution in the direct dimension.

The flip angle of the chirp pulses ($\beta$) is chosen for the balance between signal-to-noise ratio (SNR) and spectral purity. Larger $\beta$ results in higher SNR, but leads to stronger artifacts. In general, $\beta$ can be set to 15°~20°.

According to the method described above, the practical operation is as below:

This example was performed on an 11.7 T (proton resonance frequency of 500 MHz) Agilent NMR System (Agilent Technologies, Santa Clara, Calif., USA) with a 54 mm narrow bore equipped with a z field gradient, using a sample of 1 M/L n-butyl bromide in $CDCl_3$. The pulse sequence in FIG. 1 is applied.

Step 1: Record an NMR 1D $^1H$ spectrum of the sample, as shown in FIG. 2;

Step 2: Measure the duration of the 90° hard pulse, which is 13.1 µs;

Step 3: Set the range of the spectrum for analysis. Here we choose the region between 0.8 ppm and 1.9 ppm for analysis;

Step 4: Set the excitation center of the selective 180° pulse to 1.35 ppm, and set the pulse duration to 11 ms. The power of the selective 180° pulse was measured as 18 dB;

Step 5: Set the gradient $G_1$ to 0.13 G/cm;

Step 6: Set the gradient $G_s$ to 15 G/cm;

Step 7: Set the gradient $G_2$ to 3.77 G/cm;

Step 8: Set the sweep range of the chirp pulse to 25 kHz;

Step 9: Set the flip angle of the chirp pulse to 15°, and the duration to 15 ms. The power of the chirp pulse is measured as 8 dB;

Step ten: Set the gradient $G_a$ to 37.73 G/cm;

Step eleven: Set the gradient $G_p$ to 9.43 G/cm;

Step twelve: Set the duration of the acquisition window ($T_a$) to 250 µs;

Step thirteen: Set the number of increments (ni) to 32 and the number of loops (N) to 400;

Step fourteen: Use the measured 90° hard pulse as the excitation pulses of the pulse sequence. After $t_1/2$, implement the selective 180° pulse and the gradient $G_1$, then implement the PSYCHE element. And after another $t_1/2$, implement the gradient $G_1$ and $G_p$, then repeat the EPSI readout for N times and acquire NMR signals.

After the experiment, for each $t_1$, we extracted the data recorded under positive gradients and arranged them to a 2D matrix. Thus a 3D dataset was obtained and then processed by a 3D Fourier transformation. After extracting 2D spectra of relevant slices, 2D spectra respectively corresponding to scalar coupling networks of the three protons were obtained. Then relevant J coupling constants could be measured.

The spectrum in FIG. 3 corresponds to the coupling network of proton H2. From FIG. 3 we can determine the coupling relationships between H2 and H1 and between H2 and H3. Coupling constants $J^{2,1}$ and $J^{2,3}$ can be measured, corresponding to 6.9 Hz and 7.5 Hz, respectively.

The spectrum in FIG. 4 corresponds to the coupling network of proton H3. From FIG. 4 we can determine the coupling relationships between H3 and H2 and between H3 and H4. Coupling constants $J^{3,2}$ and $J^{3,4}$ can be measured, corresponding to 7.5 Hz and 7.5 Hz, respectively.

The spectrum in FIG. 5 corresponds to the coupling network of proton H4. From FIG. 5 we can determine the coupling relationships between H4 and H3. Coupling constants $J^{4,3}$ can be measured, corresponding to 7.5 Hz.

In conclusion, this invention provides a NMR multi-dimensional method for measuring coupling constants within several coupling networks. It is simple and efficient, and will find extensive applications in molecular structure elucidation.

The example described above is only a superior implementation of this invention. Therefore, the application of this invention is not limited to this example, that is, all modifications and alterations of this invention according to this invention specification is covered by the claim of this invention.

INDUSTRIAL PRACTICABILITY

This invention provides a NMR multi-dimensional method for measuring coupling constants within several coupling networks. After the excitation of the 90° hard pulse, in the middle of the evolution time $t_1$, a selective 180° pulse and a gradient are implemented simultaneously, then two chirp pulses with low flip angle and opposite sweeping direction is implemented at the presence of another gradient. The two chirp pulses are flanked by a pair of spoiling gradient for the selection of coherence transfer pathway. After the gradient $G_p$, the EPSI readout is used to record NMR signals. Several scalar networks can be revealed through our experiment, with relevant coupling constants extracted. This method is simple and efficient and will find extensive applications in molecular structure elucidation.

The invention claimed is:

1. A nuclear magnetic resonance (NMR) multi-dimensional method for measuring coupling constants within several coupling networks, including:
   1) acquiring a conventional NMR one-dimensional (1D) spectrum of a sample;
   2) measuring a duration of a 90° hard pulse;
   3) setting a range of the 1D spectrum for analysis;
   4) setting a duration of a selective 180° pulse according to an interval of the closest resonances, then measuring the power of the selective 180° pulse, and placing the excitation center of the selective 180° pulse to the center frequency of the range of the 1D spectrum for analysis;
   5) setting a spatial frequency encoding gradient ($G_1$), which satisfies $\gamma*G_1*L>SW_{1D}$, where $\gamma$ is the gyromagnetic ratio, L is the length of the detection region of the sample, and $SW_{1D}$ is the spectral width of the 1D spectrum;
   6) setting a spoiling gradient ($G_s$);
   7) setting a gradient ($G_2$), which satisfies $\gamma*G_2*L>SW_{1D}$;
   8) setting a sweep range of chirp pulses (pbw), which satisfies $pbw>\gamma*G_2*L$;
   9) setting a flip angle ($\beta$) and a duration of the chirp pulses, and measuring the power of the chirp pulses with the flip angle ($\beta$), wherein sweeping directions of the chirp pulses are opposite;
   10) setting a gradient ($G_a$), which satisfies $\gamma*G_a*L<SW$, where SW is a sampling frequency and $\gamma*G_a*L>>SW_{1D}$;
   11) setting a gradient ($G_p$), which is used to adjust positions of echo centers;
   12) setting a duration of an acquisition window ($T_a$), which satisfies $1/(2*T_a) \geq SW_{1D}$;
   13) setting a number of increments in the indirect dimension (ni) and a number of loops of the acquisition windows (N); and
   14) using the measured 90° hard pulse as excitation pulses of a pulse sequence, after $t_1/2$, implementing the selective 180° pulse and the gradient($G_1$), then implementing a PSYCHE element, and after another $t_1/2$, implementing the gradient ($G_1$) and the gradient ($G_p$), then repeating an EPSI readout for N times and acquiring NMR signals, wherein:
      the PSYCHE element includes two chirp pulses with small flip angle and opposite sweeping directions, and a simultaneously applied instance of the gradient ($G_2$),
      the PSYCHE element is flanked by two of the spoiling gradients ($G_s$), and
      the EPSI readout includes the gradient ($G_a$) and gradient ($-G_a$), and simultaneous samplings, of which a duration under one gradient is the duration ($T_a$).

2. An NMR multi-dimensional method for measuring coupling constants within several coupling networks according to claim 1, wherein:
   the number of the increments (ni) is set according to required digital resolution in the indirect dimension: $ni=SW_1/v_1$, where $v_1$ is the required digital resolution in the indirect dimension and $SW_1$ is the spectral width in the indirect dimension.

3. An NMR multi-dimensional method for measuring coupling constants within several coupling networks according to claim 1, wherein:
   the number of loops of the acquisition windows (N) is set according to a required digital resolution in the direct dimension: $N=SW_{1D}/v_2$, where $v_2$ is the required digital resolution in the direct dimension.

4. An NMR multi-dimensional method for measuring coupling constants within several coupling networks according to claim 1, wherein:
   the flip angle of the chirp pulses ($\beta$) is chosen for a balance between signal-to-noise ratio (SNR) and spectral purity, wherein a larger flip angle ($\beta$) results in higher SNR, but leads to stronger artifact, and the flip angle ($\beta$) is set to 15°~20°.

5. A nuclear magnetic resonance (NMR) multi-dimensional method for measuring coupling constants within several coupling networks, including:
   1) acquiring a conventional NMR one-dimensional (1D) spectrum of a sample;
   2) measuring a duration of a 90° hard pulse;
   3) setting a range of the 1D spectrum for analysis;
   4) setting a duration of a selective 180° pulse according to an interval of the closest resonances, then measuring the power of the selective 180° pulse, and placing the excitation center of the selective 180° pulse to the center frequency of the range of the 1D spectrum for analysis;
   5) setting a spatial frequency encoding gradient ($G_1$), which satisfies $\gamma*G_1*L>SW_{1D}$, where $\gamma$ is the gyromagnetic ratio, L is the length of the detection region of the sample, and $SW_{1D}$ is the spectral width of the 1D spectrum;
   6) setting a spoiling gradient ($G_s$);
   7) setting a gradient ($G_2$), which satisfies $\gamma*G_2*L>SW_{1D}$;
   8) setting a sweep range of chirp pulses (pbw), which satisfies $pbw>\gamma*G_2*L$;
   9) setting a flip angle ($\beta$) and a duration of the chirp pulses, and measuring the power of the chirp pulses with the flip angle ($\beta$), wherein sweeping directions of the chirp pulses are opposite;
   10) setting a gradient ($G_a$), which satisfies $\gamma*G_a*L<SW$, where SW is a sampling frequency and $\gamma*G_a*L>>SW_{1D}$;
   11) setting a gradient ($G_p$), which is used to adjust positions of echo centers;
   12) setting a duration of an acquisition window ($T_a$), which satisfies $1/(2*T_a) \geq SW_{1D}$;
   13) setting a number of increments in the indirect dimension (ni) and a number of loops of the acquisition windows (N); and
   14) using the measured 90° hard pulse as excitation pulses of a pulse sequence, after $t_1/2$, implementing the selective 180° pulse and the gradient ($G_1$), then implementing a PSYCHE element, and after another $t_1/2$, implementing the gradient ($G_1$) and the gradient ($G_p$), then repeating an EPSI readout for N times and acquiring NMR signals, wherein:

after disentangling different signals, relevant J coupling constants are measured.

6. An NMR multi-dimensional method for measuring coupling constants within several coupling networks according to claim 5, wherein:

the PSYCHE element includes two chirp pulses with small flip angle and opposite sweeping directions, and a simultaneously applied instance of the gradient ($G_2$), the PSYCHE element is flanked by two of the spoiling gradients ($G_s$), and the EPSI readout includes the gradient $G_a$ and gradient ($G_a$), and simultaneous samplings, of which a duration under one gradient is the duration ($T_a$).

7. An NMR multi-dimensional method for measuring coupling constants within several coupling networks according to claim 5, wherein:

the number of the increments (ni) is set according to a required digital resolution in the indirect dimension: ni=$SW_1/v_1$, where $v_1$ is the required digital resolution in the indirect dimension and $SW_1$ is the spectral width in the indirect dimension.

8. An NMR multi-dimensional method for measuring coupling constants within several coupling networks according to claim 5, wherein:

the number of loops of the acquisition windows (N) is set according to a required digital resolution in the direct dimension: N=$SW_{1D}/v_2$, where $v_2$ is the required digital resolution in the direct dimension.

9. An NMR multi-dimensional method for measuring coupling constants within several coupling networks according to claim 5, wherein:

the flip angle of the chirp pulses ($\beta$) is chosen for a balance between signal-to-noise ratio (SNR) and spectral purity, wherein a larger flip angle ($\beta$) results in higher SNR, but leads to stronger artifacts, and the flip angle ($\beta$) is set to 15°~20°.

10. An NMR multi-dimensional method for measuring coupling constants within several coupling networks according to claim 5, wherein:

the disentangling comprises:

for each $t_1$, extracting data recorded under positive gradients and arranging the extracted data in a two-dimensionale (2D) matrix, thus obtaining a three-dimensional (3D), dataset;

processing the 3D dataset by a 3D Fourier transformation;

after extracting 2D spectra of relevant slices, obtaining 2D spectra respectively corresponding to scalar coupling networks of different protons; and then measuring the relevant J coupling constants.

* * * * *